United States Patent [19]
Huang et al.

[11] Patent Number: 6,107,153
[45] Date of Patent: Aug. 22, 2000

[54] METHOD OF FORMING A TRENCH CAPACITOR FOR A DRAM CELL

[75] Inventors: Li-Ping Huang, Taipei; Shye-Lin Wu, Hsinchu, both of Taiwan

[73] Assignee: Texas Instruments -Acer Incorporated, Hsinchu, Taiwan

[21] Appl. No.: 09/013,689

[22] Filed: Jan. 26, 1998

[51] Int. Cl.[7] .................................................. H01L 21/10
[52] U.S. Cl. .......................... 438/389; 438/390; 257/301
[58] Field of Search .................... 438/243, 246, 438/244, 238, 302, 247, 248, 524, 386, 389, 390; 257/382, 401, 305, 302

[56] References Cited

U.S. PATENT DOCUMENTS

| | | | |
|---|---|---|---|
| 4,604,150 | 8/1986 | Lin ........................................... | 438/392 |
| 5,057,444 | 10/1991 | Fuse et al. ............................... | 438/524 |
| 5,223,447 | 6/1993 | Lee et al. ................................. | 438/247 |
| 5,252,845 | 10/1993 | Kin et al. ................................. | 257/302 |
| 5,330,926 | 7/1994 | Sato ......................................... | 438/243 |
| 5,395,786 | 3/1995 | Hsu et al. ................................. | 438/248 |
| 5,498,564 | 3/1996 | Geissler et al. .......................... | 438/247 |

OTHER PUBLICATIONS

B.W. Shen et al., Scalability of a Trench Capacitor Cell for 64 MBIT DRAM, 1989 IEEE, pp. 27–30.

Takeshi Hamamoto et al., Characterization of the Cell Leakage of a Stacked Trench Capacitor (STT) Cell, 1994 IEEE, pp. 1801–1805.

*Primary Examiner*—Wael Fahmy
*Assistant Examiner*—William David Coleman
*Attorney, Agent, or Firm*—Harness, Dickey & Pierce, P.L.C.

[57] ABSTRACT

A method for forming a trench capacitor of a dynamic random access memory cell is disclosed. The method includes patterning to etch a semiconductor substrate (10) of a first conductivity to form a trench (18) in the substrate. Ions of the first conductivity are tilt-implanted over the trench, so that sidewalls and a bottom surface of the substrate near the trench are doped with the ions of the first conductivity. Next, first ions of a second conductivity are tilt-implanted over the trench at a first angle, thereby forming a first implanted region (22), followed by tilt-implanting second ions of the second conductivity over the trench at a second angle, thereby forming a second implanted region (24). The first angle is larger than the second angle, and the first implanted region and the second implanted region together form a bottom cell plate of the trench capacitor. Finally, a dielectric layer (26) is formed on the bottom plate of the trench capacitor, and a conductive layer (28) is formed in the trench, thereby forming a top cell plate of the trench capacitor.

14 Claims, 4 Drawing Sheets

METHOD OF FORMING A TRENCH CAPACITOR FOR A DRAM CELL

BACKGROUND OF THE INVENTION

1. Field of the Invention

The present invention relates to dynamic random access memory (DRAM) fabrication, and more particularly, to a method of forming a trench capacitor for a dynamic random access memory cell.

2. Description of the Prior Art

The increasing popularity of electronic equipment such as computers has driven the demand for large semiconductor memories. The array configuration of semiconductor memory lends itself well to the regular structure preferred in "very large scale integration" (VLSI) integrated circuits. Dynamic random access memories (DRAMs) have become one of the most widely used types of semiconductor memory due to its low cost per bit, high device density and flexibility of use concerning reading and writing operations.

Early DRAMs used storage cells each consisting of three transistors and were manufactured using P type channel metal-oxide-semiconductor (PMOS) technology. Later, a DRAM storage cell structure consisting of one transistor and one capacitor was developed. The gate of the transistor is controlled by a word line signal, and data, represented by the logic level of a capacitor voltage, is written into or read out of the capacitor through a bit line.

As the semiconductor memory device becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ratio in reading the memory cell and to reduce soft errors (due to alpha particle interference). Therefore, it is desirable to reduce the cell dimension and yet obtain a high capacitance, thereby achieving both high cell integration and reliable operation.

When DRAM cells are scaled down while maintaining cell capacitance, three-dimensional cell structures, such as trench capacitors, are widely developed. One of advantages of the trench capacitor cell is its large capacitance and planar topography. However, trench-to-trench leakage current becomes a primary constraint, especially when the trench-to-trench spacing in the DRAMs is reduced below 0.8 $\mu$m. This trench-to-trench leakage problem is widely discussed in, for example, the reference by B. W. Shen et al., "Scalability of a Trench Capacitor Cell for 64 Mbit DRAM," IEDN Tech. Dig., 1989, pages 27–30, and the reference by Takeshi Hamamoto et al., "Characterization of the Cell Leakage of a Stacked trench Capacitor (STT) Cell," IEEE Transactions on Electron Devices, Vol. 41, No. 10, October, 1994, pages 1801–1805, which are hereby incorporated by reference.

SUMMARY OF THE INVENTION

In accordance with the present invention, a method is provided for forming a trench capacitor of a dynamic random access memory cell that substantially suppresses trench-to-trench leakage current. In one embodiment, a pad oxide layer is formed on a semiconductor substrate of a first conductivity, and a silicon nitride layer is formed on the pad oxide layer. Next, ions of the first conductivity are implanted into a portion of the substrate to form a well region of the first conductivity in the substrate, and the silicon nitride layer, the pad oxide layer, and a portion of the substrate are patterned to form a trench therein. Ions of the first conductivity are rotationally tilt-implanted over the trench, so that a doped region of the first conductivity is formed along sidewalls and a bottom surface of the substrate, followed by thermally annealing the doped region to drive the ions into the substrate. Further, first ions of a second conductivity are rotationally tilt-implanted over the trench at a first angle, thereby forming a first implanted region. Second ions of the second conductivity are rotationally tilt-implanted over the trench at a second angle, thereby forming a second implanted region, the first angle being larger than the second angle, wherein the first implanted region and the second implanted region together form a bottom cell plate of the trench capacitor. To complete the present invention, a stacked oxide-nitride-oxide film is formed on the bottom plate of the trench capacitor, and a conductive layer is then formed in the trench, thereby forming a top cell plate of the trench capacitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
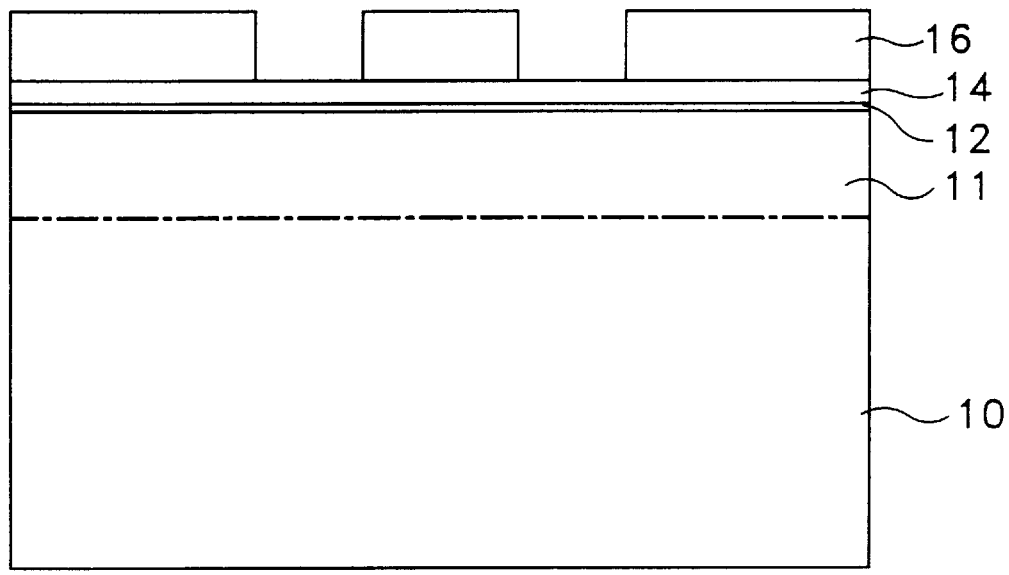
FIG. 1 shows a cross-sectional view illustrative of a portion of a dynamic random access memory (DRAM) cell in accordance with one embodiment of the present invention.

FIG. 1 shows a cross-sectional view illustrative of a portion of a dynamic random access memory (DRAM) cell in accordance with one embodiment of the present invention, wherein a pad oxide layer 12 (such as a silicon oxide layer) and a silicon nitride layer 14 are sequentially formed on a semiconductor substrate 10 (such as a p-type semiconductor substrate). This silicon oxide layer 12 is formed by thermal oxidation, or is deposited, for example, using a conventional low pressure chemical vapor deposition (LPCVD) or plasma enhanced chemical vapor deposition (PECVD) process. The thickness of this silicon oxide layer 12 can range from about 30 to 500 angstroms. In this embodiment, the silicon nitride layer 14 is deposited using a conventional low pressure chemical vapor deposition (LPCVD) or plasma enhanced chemical vapor deposition (PECVD) to a thickness of about 500–3000 angstroms.

Afterwards, a p-type well 11 is formed in the semiconductor substrate 10, for example, by a standard high energy boron implant. A photoresist layer 16 is then formed and patterned on the silicon nitride layer 14 using conventional photolithographic techniques to define trench regions.

Figure 2:
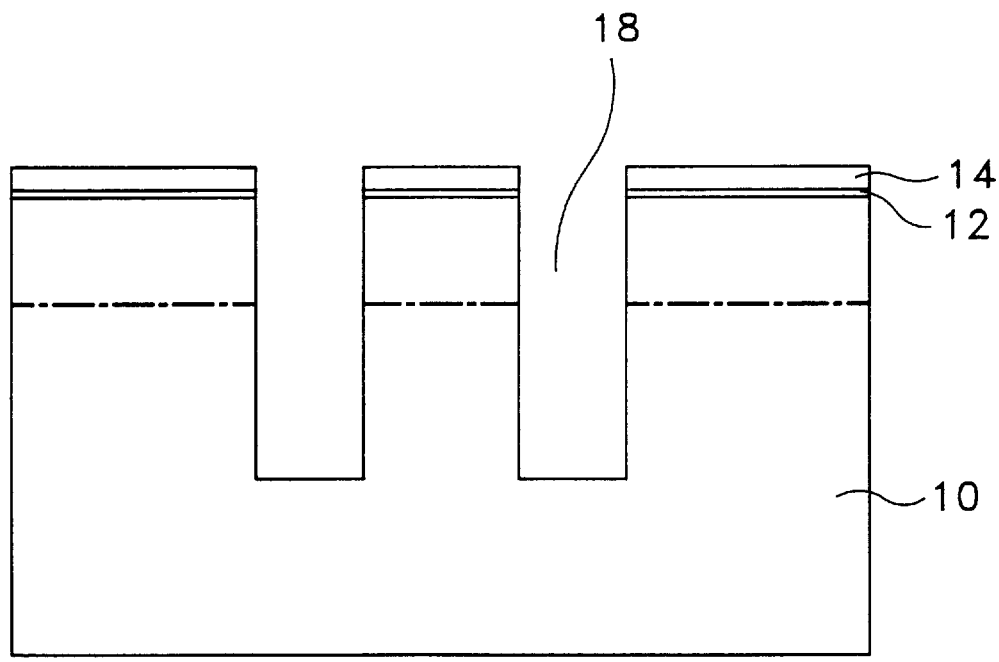
FIG. 2 shows a cross-sectional view illustrative of the trench regions.

Using the photoresist layer 16 as a mask, the silicon nitride layer 14, the silicon oxide layer 12, and a portion of the substrate 10 are etched to form trench regions 18 as shown in FIG. 2. In this embodiment, the etching process for forming the trench regions 18 is preferably done by a standard plasma etch method or a reactive ion etch (RIE).

Figure 3:
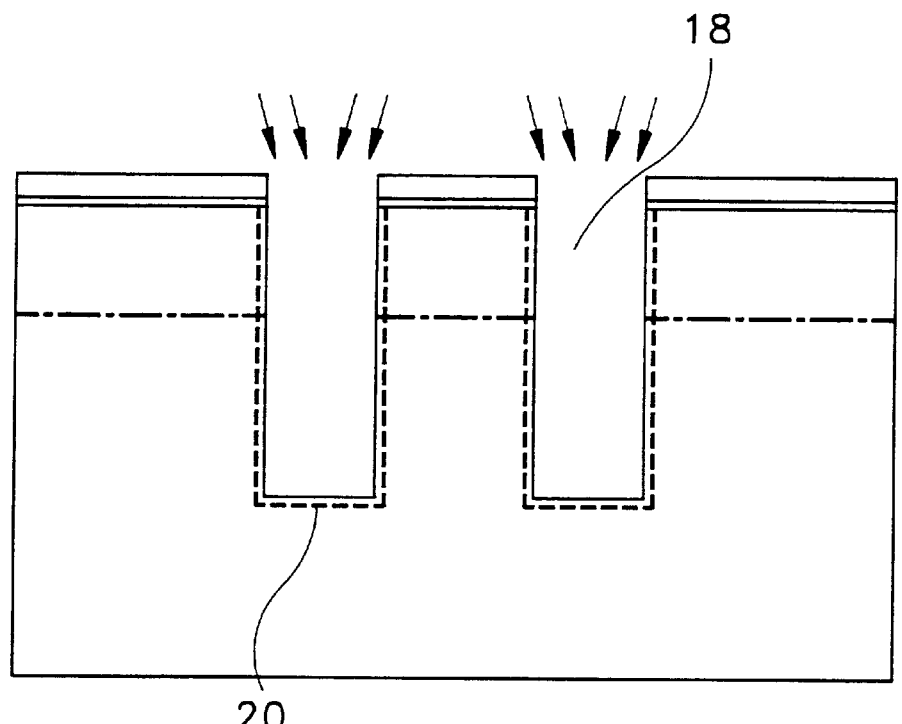
FIG. 3 shows that a low dose and small angle boron rotation implant is performed over the trench regions.

In FIG. 3, a low dose (about $10^{11}$–$10^3$ atoms/cm$^2$) and small-angle boron rotation tilt-implant is performed over the trench regions 18 to increase concentration on the trench cell edge, thereby forming boron doped regions 20, which then serves to suppress bulk punchthrough current, and to make the cell down-scaling possible. In this disclosure, the term "small angle" is used according to the convention used in semiconductor industry, and is generally referred to an angle between 1 to 15 degree.

Figure 4:
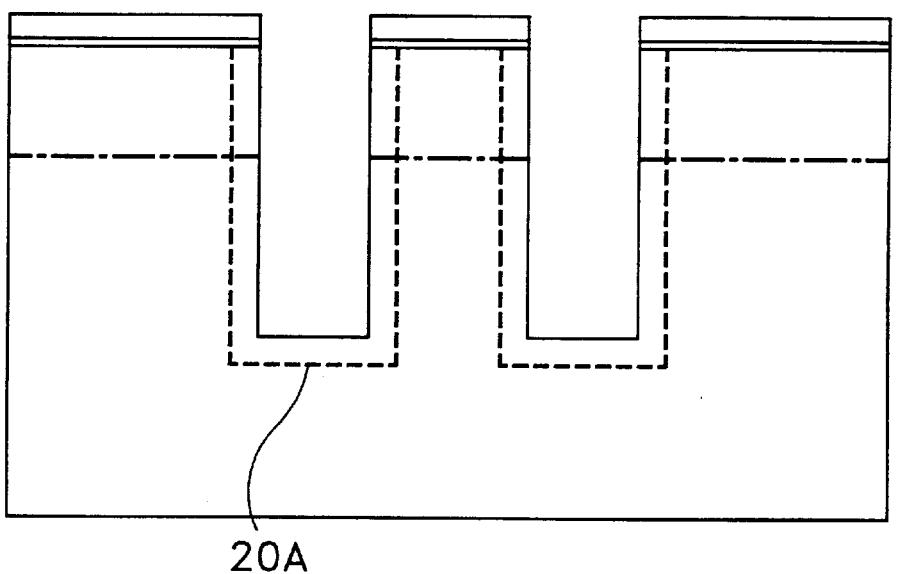
FIG. 4 shows a cross-sectional view of the p-type regions.

Next, the boron doped regions 20 are subjected to a thermal anneal at about 500–950° C., driving the boron further into the substrate 10 to form p-type regions 20A as shown in FIG. 4.

Figure 5:
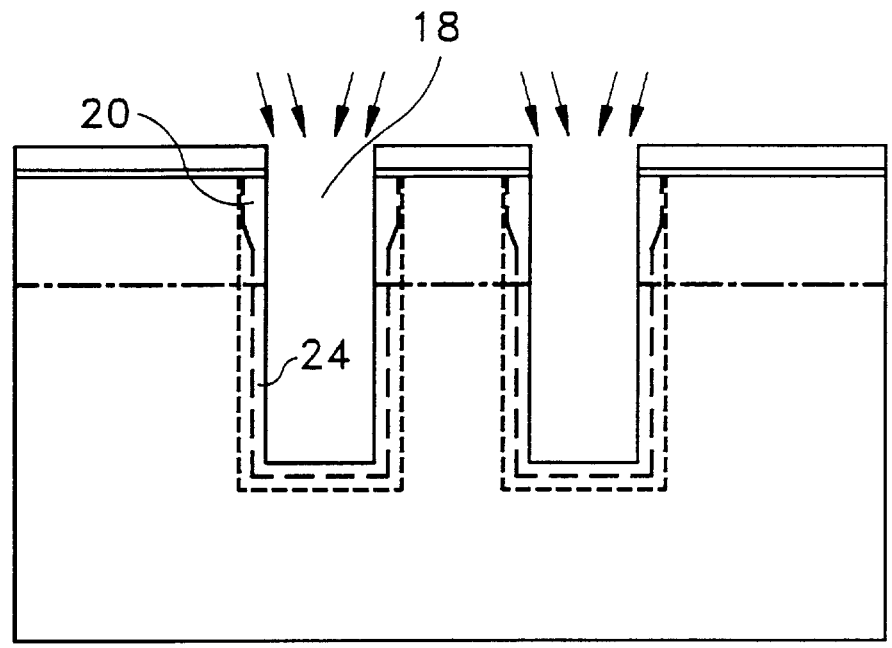
FIG. 5 illustrates that a bottom cell electrode of the trench capacitor of the DRAM is formed.

In FIG. 5, a large-angle arsenic (As) rotation-implant is performed over the trench regions 18 to form implant regions 22. Next, a small-angle arsenic (As) rotation-implant is performed over the trench regions 18 to form another implant regions 24. The implant regions 22 and 24 together form a bottom cell electrode of the trench capacitor of the DRAM. It is appreciated that the sequence of the large angle implant and the small angle implant can be reversed in the embodiment without affecting subsequent steps. In this disclosure, the term "large angle" is used according to the convention used in semiconductor industry, and is generally referred to an angle between 10 to 60 degree.

Figure 6:
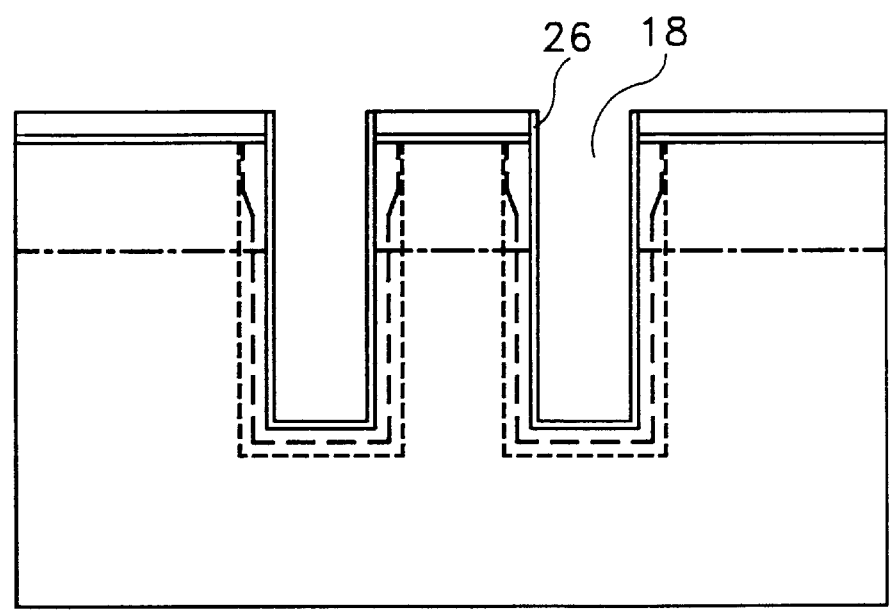
FIG. 6 shows a cross-sectional view illustrative of a dielectric film of the trench capacitor of the DRAM formed on the sidewalls and the bottom surface of the trench regions.

Referring to FIG. 6, a dielectric film 26 of the trench capacitor of the DRAM is formed on the sidewalls and the bottom surface of the trench regions 18. In this embodiment, stacked oxide-nitride-oxide (ONO) film is used as the material of the dielectric layer 26. As is known in the art of DRAM fabrication, the ONO film is reliable over shaped silicon surfaces, and is typically used as a capacitor insulator. The bottom oxide layer of the stacked oxide-nitride-oxide (ONO) film 26 is conventionally formed by thermally oxidizing the silicon surface, depositing an LPCVD silicon nitride layer and then oxidizing the silicon nitride layer to form the top oxide layer. Other material, such as NO, $Ta_2O_5$, $TiO_2$, PZT, or BST can be used as the thin dielectric layer 26.

Figure 7:
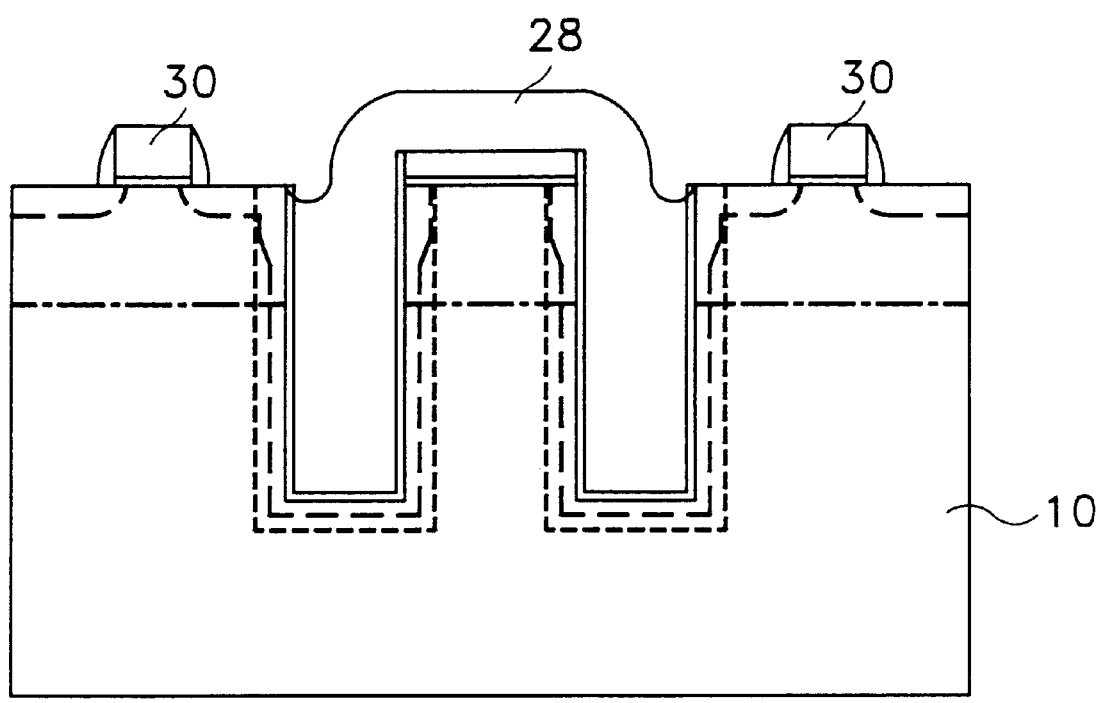
FIG. 7 shows a cross-sectional view illustrative of a conductive field plate and pass transistors formed in the trench regions.

To complete the present invention, a conductive field plate 28 is formed in the trench regions 18 as the top electrode of the trench capacitor of the DRAM as shown in FIG. 7. Finally, pass transistors 30 are formed on the substrate 10 by a standard process.

Although specific embodiments have been illustrated and described, it will be obvious to those skilled in the art that various modifications may be made without departing from the spirit which is intended to be limited solely by the appended claims.

What is claimed is:

1. A method for forming a trench capacitor of a memory cell, said method comprising:

patterning to etch a semiconductor substrate of a first conductivity, thereby forming a trench in said substrate;

tilt-implanting ions of the first conductivity over the trench, so that sidewalls and a bottom surface of said substrate in the trench are doped with said ions of the first conductivity;

tilt-implanting first ions of a second conductivity over the trench at a first angle, thereby forming a first implanted region;

tilt-implanting second ions of the second conductivity over the trench at a second angle, thereby forming a second implanted region, said first angle being different from said second angle, wherein said first implanted region and said second implanted region together form a bottom cell plate of the trench capacitor;

forming a dielectric layer on said bottom plate of the trench capacitor; and forming a conductive layer in said trench, thereby forming a top cell plate of the trench capacitor.

2. The method according to claim 1, wherein said dielectric layer comprises a stacked oxide-nitride-oxide film.

3. The method according to claim 1, wherein said first angle is about 1–15 degree.

4. The method according to claim 1, wherein said second angle is about 10–60 degree.

5. The method according to claim 1, further comprising annealing said substrate after the ions of the first conductivity are firstly tilt-implanted.

6. A method for forming a trench capacitor of a dynamic random access memory cell, said method comprising:

forming a pad oxide layer on a semiconductor substrate;

forming a silicon nitride layer on said pad oxide layer;

implanting ions of a first conductivity into a portion of said substrate to form a well region of the first conductivity;

patterning to etch said silicon nitride layer, said pad oxide layer, and a portion of said substrate, thereby forming a trench therein;

tilt-implanting ions of the first conductivity over the trench, so that sidewalls and a bottom surface of said substrate in the trench are doped with said ions of the first conductivity;

thermally annealing said substrate to drive said ions into said substrate;

tilt-implanting first ions of a second conductivity over the trench at a first angle, thereby forming a first implanted region;

tilt-implanting second ions of the second conductivity over the trench at a second angle, thereby forming a second implanted region, said first angle being larger than said second angle, wherein said first implanted region and said second implanted region together form a bottom cell plate of the trench capacitor;

forming a dielectric layer on said bottom plate of the trench capacitor; and forming a conductive layer in said trench, thereby forming a top cell plate of the trench capacitor.

7. The method according to claim 6, wherein said dielectric layer comprises a stacked oxide-nitride-oxide film.

8. The method according to claim 6, wherein said first angle is about 1–15 degree.

9. The method according to claim 6, wherein said second angle is about 10–60 degree.

10. A method for forming a trench capacitor of a dynamic random access memory cell, said method comprising:

forming a pad oxide layer on a semiconductor substrate of a first conductivity;

forming a silicon nitride layer on said pad oxide layer;

implanting ions of the first conductivity into a portion of said substrate to form a well region of the first conductivity in said substrate;

patterning to etch said silicon nitride layer, said pad oxide layer, and a portion of said substrate, thereby forming a trench therein;

rotationally tilt-implanting ions of the first conductivity over the trench, so that a doped region of the first conductivity is formed along sidewalls of the trench and a bottom surface of said substrate;

thermally annealing said doped region to drive said ions into said substrate;

rotationally tilt-implanting first ions of a second conductivity over the trench at a first angle, thereby forming a first implanted region;

rotationally tilt-implanting second ions of the second conductivity over the trench at a second angle, thereby forming a second implanted region, said first angle being larger than said second angle, wherein said first implanted region and said second implanted region together form a bottom cell plate of the trench capacitor;

forming a stacked oxide-nitride-oxide film on said bottom plate of the trench capacitor; and forming a conductive layer in said trench, thereby forming a top cell plate of the trench capacitor.

11. The method according to claim 10, wherein said first angle is about 1–15 degree.

12. The method according to claim 10, wherein said second angle is about 10–60 degree.

13. The method according to claim 10, wherein said substrate is etched using a plasma etch process.

14. The method according to claim 10, wherein said substrate is etched using a reactive ion etch process.

* * * * *